(12) United States Patent
Hossain et al.

(10) Patent No.: US 11,463,283 B1
(45) Date of Patent: *Oct. 4, 2022

(54) SPLIT-PATH EQUALIZER AND RELATED METHODS, DEVICES AND SYSTEMS

(71) Applicant: Rambus Inc., San Jose, CA (US)

(72) Inventors: Masum Hossain, Edmonton (CA); Jared L. Zerbe, Woodside, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/073,963

(22) Filed: Oct. 19, 2020

Related U.S. Application Data

(63) Continuation of application No. 15/185,793, filed on Jun. 17, 2016, now Pat. No. 10,848,350, which is a
(Continued)

(51) Int. Cl.
| | |
|---|---|
| *H04L 25/03* | (2006.01) |
| *H04L 7/033* | (2006.01) |
| *H03L 7/00* | (2006.01) |
| *H03L 7/08* | (2006.01) |
| *H04L 25/08* | (2006.01) |
| *H04L 7/00* | (2006.01) |

(52) U.S. Cl.
CPC .......... *H04L 25/03057* (2013.01); *H03L 7/00* (2013.01); *H03L 7/0807* (2013.01); *H04L 7/0087* (2013.01); *H04L 7/033* (2013.01); *H04L 25/03038* (2013.01); *H04L 25/085* (2013.01)

(58) Field of Classification Search
CPC . H04L 25/03057; H04L 7/033; H04L 25/085; H04L 7/0087; H04L 25/03038; H03L 7/00; H03L 7/0807
See application file for complete search history.

(56) References Cited

U.S. PATENT DOCUMENTS

| | | |
|---|---|---|
| 7,499,489 B1 | 3/2009 | Ellersick et al. |
| 7,715,509 B2 | 5/2010 | Stojanovic et al. |
| (Continued) | | |

OTHER PUBLICATIONS

Savoj, J., et al., "A Wide Common-Mode Fully-Adaptive Multi-Standard 12.5Gb/s Backplane Transceiver in 28nm CMOS", 2012 Symposium on VLSI Circuits (VLSIC) Digest of Technical Papers, 2012, pp. 104-105. 2 Pages.
(Continued)

*Primary Examiner* — Sam K Ahn
*Assistant Examiner* — Amneet Singh
(74) *Attorney, Agent, or Firm* — Marc P. Schuyler

(57) ABSTRACT

This disclosure provides a split-path equalizer and a clock recovery circuit. More particularly, clock recovery operation is enhanced, particularly at high-signaling rates, by separately equalizing each of a data path and an edge path. In specific embodiments, the data path is equalized in a manner that maximizes signal-to-noise ratio and the edge path is equalized in a manner that emphasizes symmetric edge response for a single unit interval and zero edge response for other unit intervals (e.g., irrespective of peak voltage margin). Such equalization tightens edge grouping and thus enhances clock recovery, while at the same time optimizing data-path sampling. Techniques are also disclosed for addressing split-path equalization-induced skew.

18 Claims, 6 Drawing Sheets

Related U.S. Application Data continuation of application No. 14/050,223, filed on Oct. 9, 2013, now Pat. No. 9,397,868.

(60) Provisional application No. 61/735,687, filed on Dec. 11, 2012.

(56) References Cited

U.S. PATENT DOCUMENTS

| | | | |
|---|---|---|---|
| 8,395,446 | B1 | 3/2013 | Tran |
| 8,396,110 | B1 | 3/2013 | Hsieh |
| 8,654,830 | B1 | 2/2014 | Lin et al. |
| 8,947,840 | B1 | 2/2015 | Milirud et al. |
| 2002/0034222 | A1 | 3/2002 | Buchwald et al. |
| 2004/0091037 | A1* | 5/2004 | Balasubramonian ........................ H04L 7/0029 375/232 |
| 2006/0008279 | A1 | 1/2006 | Chiang et al. |
| 2006/0188043 | A1 | 8/2006 | Zerbe et al. |
| 2007/0064845 | A1 | 3/2007 | Phanse et al. |
| 2007/0153887 | A1 | 7/2007 | Tate et al. |
| 2009/0141846 | A1 | 6/2009 | Hibi |
| 2009/0161747 | A1 | 6/2009 | Aziz et al. |
| 2009/0167402 | A1 | 7/2009 | Tian et al. |
| 2009/0232196 | A1 | 9/2009 | Sunaga et al. |
| 2009/0316770 | A1 | 12/2009 | Hidaka |
| 2010/0027606 | A1 | 2/2010 | Dai et al. |
| 2010/0046601 | A1 | 2/2010 | Momtaz et al. |
| 2010/0066450 | A1 | 3/2010 | Palmer et al. |
| 2010/0103999 | A1* | 4/2010 | Leibowitz ............... G06F 13/38 375/233 |
| 2012/0072784 | A1 | 3/2012 | Li et al. |
| 2012/0082203 | A1 | 4/2012 | Zerbe et al. |
| 2013/0114663 | A1 | 5/2013 | Ding et al. |
| 2014/0307769 | A1 | 10/2014 | He et al. |

OTHER PUBLICATIONS

Wong et al., "Edge and Data Adaptive Equalization of Serial-Link Transceivers," IEEE Journal of Solid-State Circuits, vol. 43, No. 9, Sep. 2008, pp. 2157-2169. 13 pages.

Wong et al., "Modified LMS Adaptation Algorithm for a Discrete-Time Edge Equalizer of Serial I/O," IEEE, Solid-State Circuits Conference, Nov. 2006, pp. 387-390. 4 pages.

* cited by examiner

SPLIT-PATH EQUALIZER AND RELATED METHODS, DEVICES AND SYSTEMS

This patent application is a continuation of U.S. Utility application Ser. No. 15/185,793, filed on Jun. 17, 2016, for "Split-Path Equalizer And Related Methods, Devices And Systems," which in turn is a continuation of U.S. Utility application Ser. No. 14/050,223, filed on Oct. 9, 2013, for "Split-Path Equalizer And Related Methods, Devices And Systems" (issued on Jul. 19, 2016 as U.S. Pat. No. 9,397, 868) which in turn claims benefit to U.S. Provisional Application No. 61/735,687, filed Dec. 11, 2012, for "Split-Path Equalizer And Related Methods, Devices And Systems." The aforementioned applications are hereby incorporated by reference herein in their entirety.

This disclosure relates to an equalizer that simultaneously uses two different equalization settings for respective equalized outputs from the same input signal. This disclosure also relates to equalization techniques that can be applied to a clock recovery circuit to provide more accurate recovery of timing embedded in an incoming data signal.

BACKGROUND

Clock and data recovery (CDR) circuits are used in high-speed receivers to recover timing information from an incoming data signal. Many clock and data recovery circuits are predicated upon a basic design designated 101 in FIG. 1. An incoming data signal is received via an external signaling path 103, here a pair of differential conductors, and is processed to extract the recovered clock 105 and individual data symbols. A sampling clock 111 times sampling of the incoming data signal by a first sampler 113 to occur at the approximate middle of a "data eye" associated with each symbol. The first sampler 113 outputs data samples as signal 119 representing these symbols. A second sampler 115 receives an edge clock, which in this case is the recovered clock 105, and this second sampler outputs a signal 117 representing discrete edge samples. Responsive to these edge and data samples, 117 and 119, logic 121 identifies logic level transitions between adjacent symbols, and then advances or delays the recovered clock so as to align it with those transitions. That is, the CDR logic identifies changes in symbol value (e.g., 0-1 or 1-0 for successive bits in a binary signaling scheme) and triggers use of the voltage sample taken at exact transition time with an expected transition voltage mid-point. For example, assuming a signal that crosses a threshold (Th) at the midpoint of a transition, a clock recovery circuit would expect to see edge samples at precisely Th volts for a properly aligned recovered clock; any deviation from this threshold would instead indicate that the recovered clock was early or late, depending on the direction of transition. If, for example, symbol transition were from binary "1" (positive voltage on a specific signal path) to a binary "0" (negative voltage on the specific signal path), a positive voltage edge sample would indicate that the recovered clock was early. If the symbol transition were from binary "0" to a binary "1," this would indicate that the recovered clock was late. If a negative voltage edge sample were taken at a transition from a binary "1" to a binary "0," this would also indicate that the recovered clock was late. Finally, a positive voltage edge sample at this later transition would indicate the recovered clock was early.

The current trend for high-speed signaling between integrated circuits (ICs) is toward signaling rates well into the Gigahertz range. However, at and above these signaling rates, it becomes difficult to identify logic states of the digital symbols without some form of equalization. Two conventional forms of receiver-based equalization include linear equalization, one common embodiment being continuous-time linear equalization (CTLE), and decision feedback equalization (DFE); these are each indicated in FIG. 1 by the presence of respective CTLE and DFE circuits 123 and 125. A CTLE circuit 123 is typically used to boost high frequencies relative to low frequencies and thus flatten the channel response (i.e., to counteract the AC attenuation prevalent in wired signaling systems). A DFE circuit 125 instead of flattening the frequency response simply removes the ISI present from the previous data symbol. A DFE circuit can also be used to negate long-latency reflections in the signaling line that closely correlate with previously received data. The DFE 125 circuit is for this reason illustrated in dashed-lines to indicate that it is only sometimes present in these very high-speed signaling systems.

Unfortunately, while some form of equalization is usually needed to recover data at high signaling rates, such equalization is not necessarily helpful for clock recovery. What is needed is an improved equalization technique for clock recovery. Further still, what is needed is a more accurate clock and data recovery technique usable at high signaling rates. The present technology satisfies these needs and provides further, related advantages.

Figure 1:
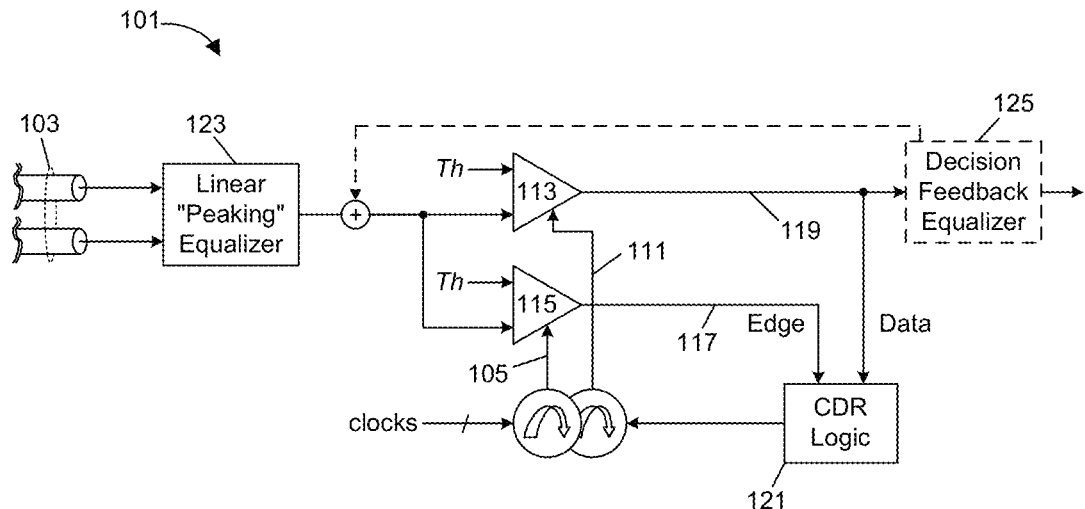
FIG. 1 shows a clock recovery circuit 101.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application to certain methods and devices. The description set out below exemplifies (i) a split-path equalizer, (ii) an improved clock recovery circuit that uses split-path equalization for enhanced clock recovery, (iii) an integrated circuit having one or more such split path equalizers and/or clock recovery circuits, and (iv)

related methods, devices and systems. While the specific examples are presented, the principles described herein may also be applied to other methods, devices and systems as well.

DETAILED DESCRIPTION

I. Introduction

Embodiments presented herein provide a split-path equalizer that can be used in a receiver circuit. Optionally applied to recovery of an embedded clock by an integrated circuit (IC), techniques provided below permit use of independent equalization parameters for each of data- and edge-sampling paths, thereby facilitating greater precision in clock recovery and lower bit-error rate in data recovery. Note that challenges in interpreting a data signal and in reconciling different equalization needs of data and edge paths become more exacerbated at higher signaling rates. By addressing the problems and needs referenced above, the techniques disclosed herein effectively extend clock recovery techniques to such higher signaling rates.

One embodiment provides a split-path equalizer having a dedicated equalization circuit for each path. Each equalization circuit receives the same signal input, and each equalization circuit provides an output that has been subject to one or more respective correction factors. In detailed implementations, each equalization circuit can be a continuous-time linear equalizer (CTLE) with digital or analog components that provide for a specific frequency-dependent gain, a specific level of amplification or attenuation, a respective frequency cut-off, or a combination of these things. At least one of the equalization circuits can have such a parameter or setting (e.g., frequency-dependent gain, amplification/attenuation or frequency cut-off) that is different from the other equalization circuit. As mentioned, in specific implementations, the split-path equalizer is part of an IC, employed to receive an incoming data signal from an external, conductive lane. In specific embodiments, the IC can receive multiple such lanes of such traffic, with a split-path equalizer and high-speed receiver for each such lane.

In designs set forth below, split-path equalization techniques such as those just discussed are applied to clock recovery. That is, a first set of equalization settings are applied to a data recovery path in a clock and data recovery application, and a second set of equalization settings are applied to an edge path. Note that for some high-speed designs, this can result in a locked clock that is optimized for edge samples but that may need special adjustment for data samples. That is, the split path equalization can result in skew such that an otherwise ideal sampling point (e.g., based on 90-degree separation from clock edge) is no longer appropriate. This skew may vary according to equalization settings applied to the respective paths, and therefore may vary as equalization settings are changed or adjusted. Therefore, some embodiments discussed below provide split-path skew compensation. This compensation generates an offset for a data-sampling clock relative to a recovered clock or edge clock. In one embodiment, a bit error rate (BER) is measured once a recovered clock is locked and used to select the specific data-sampling phase. In yet another embodiment, this phase is selected in a manner that does not require prior locking of a recovered clock, i.e., to obtain data reliable data samples that can assist with identification of the recovered clock. As should be appreciated, this technique has ready application to some high-speed serial signaling protocols such as PCI Express, Serial ATA, Display Port, IEEE 802.03 and other signaling standards. In these environments, fast clock lock is typically desired even when an input signal has been lost or has not yet been detected; conventionally, accurate data samples would be needed as a prerequisite for the traditional clock recovery function.

This disclosure also provides a number of further options that help provide for effective equalization and optional, effective clock and data recovery. First, in one embodiment, data is recovered using a partial-response decision feedback equalizer (PrDFE, also known as a loop-unrolled circuit). In the context of a split-path equalizer, a first path is subject to first equalization parameters, resulting in a first equalized signal. The PrDFE uses clocked samplers to generate conditional samples of data from the first equalized signal, each conditional sample based on a respective threshold. That is, the each sampler presumes a different level of intersymbol interference or "ISI" arising from a prior digital symbol. As the logic state of each digital symbol in a sequence is resolved, that logic state is then applied to help select one of the conditional samples as representing the ensuing symbol. A second path is subject to second equalization parameters, resulting in a second equalized signal. This second equalized signal can be used for edge sampling.

In yet another variation, in lieu of or in addition to using PrDFE, the techniques provided herein can be used with a conventional decision feedback equalizer (DFE), e.g., with some adjustment to input voltage or a sampling threshold as a result of a weighted function of the logics state(s) of one or more previous digital symbols.

These and other optional features and design techniques will be more thoroughly discussed below.

Generally speaking, FIGS. 2-4 below are used to explain structure of a split-path equalizer and its application to clock recovery, while FIGS. 5A-6 will be used to discuss specific clock recovery circuits. Following that discussion, FIGS. 7-8 will be used to discuss skew mitigation techniques in a clock recovery circuit and effective data sampling in absence of a locked clock. Finally, FIG. 9 will be used to provide additional detail on an IC that includes plural split-path equalizers and clock recovery circuits, one for each of multiple lanes carrying a respective serial data signal.

II. Split-Path Equalization and its Application to Clock Recovery

Figure 2:
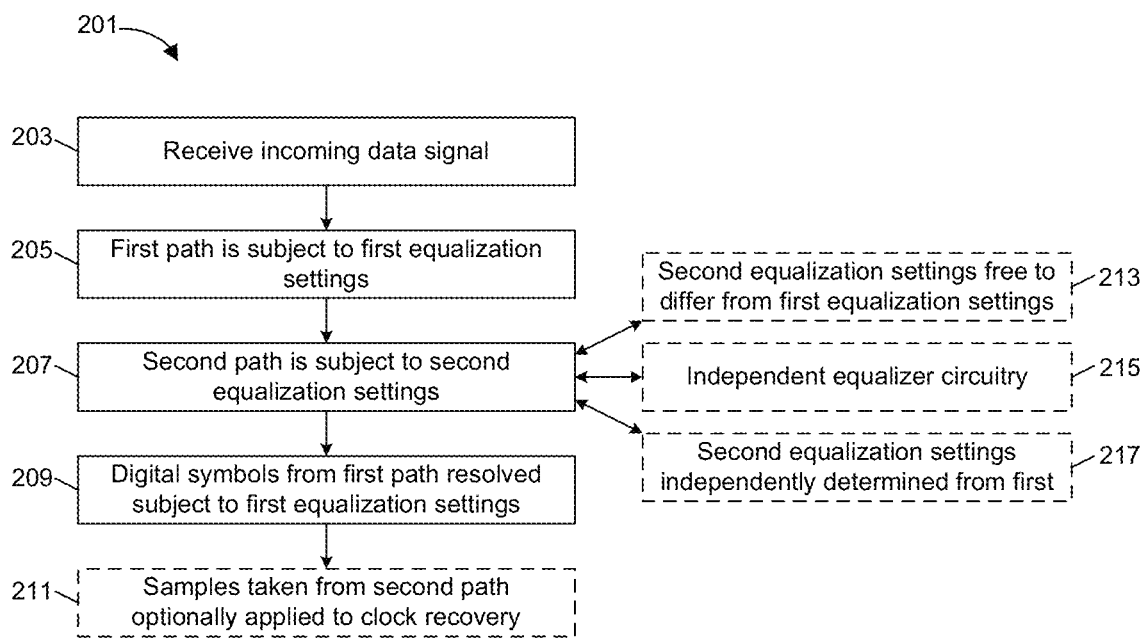
FIG. 2 is an illustrative diagram showing equalization techniques that facilitate improved clock recovery.

FIG. 2 outlines principal components of split-path equalization 201. First, an incoming data signal is received as indicated by reference numeral 203. This incoming data signal represents a sequence of digital symbols and a receiver is tasked with identifying the logic state of each digital symbol. Each possible logic state represents a number and it is the receiver's function to identify each number correctly. For embodiments where the split-path equalization 201 is embodied in an integrated circuit (IC) receiver, each symbol will generally be a binary value ("0" or "1" as determined from input voltage), but it is also possible for each symbol to represent multiple bits, e.g., using multiple pulse amplitude modulation, or "MPAM." With MPAM, there are more than two possible logic states that can be carried by each digital symbol. For example, one type of signaling referred to as 4PAM uses one of four different voltage levels for each symbol, each voltage level representing a corresponding one of four possible numbers. Irrespective of data encoding, the incoming data signal once received is passed to a point where its path will be split. The incoming data signal can optionally be equalized or otherwise processed to the extent it is desired to have processing common to each split path. Following path split, a first copy of the incoming data signal is equalized using a first set of equalization settings, per reference numeral 205; this yields a first output. Another copy of the incoming data signal is also equalized in parallel using a second set of equalization settings, per reference numeral 207; this yields a second output. As denoted by reference numeral 209, the first output is processed to resolve the logic state for each symbol as mentioned. That is to say, the first set of equalization settings are used to process the incoming data signal to make discrimination of the logic states easier. Typically, this processing enhances the signal-to-noise ratio of the incoming data signal, so as to minimize the likelihood of error in logic state interpretation. The second set of equalizations settings process the incoming data signal for some other purpose. As indicated by reference numeral 211, this other purpose can optionally include clock recovery, such as for example, enhancing the incoming data signal to improve consistency of logic state transition times (i.e., to yield better edge distribution). Improving this distribution and the consistency of edge transition time leads to a more accurate interpretation of timing information embedded in the incoming data signal. FIG. 2 also illustrates several other optional features of split-path equalization 201. Specifically, as indicated by reference numeral 213, one or more the equalization parameters for each of the split-paths can differ. Per numeral 215, at least some independent circuitry can be used for each path to implement these respective parameters. For example, in one embodiment discussed below, a first continuous-time linear equalizer (CTLE) circuit can process a first copy of the incoming data signal, while a second CTLE circuit can process a second copy of the incoming data signal, each providing a respective output. Finally, per numeral 217 it is also possible to independently determine (i.e., independently measure, calibrate and/or set) equalization settings for each path.

Figure 3:
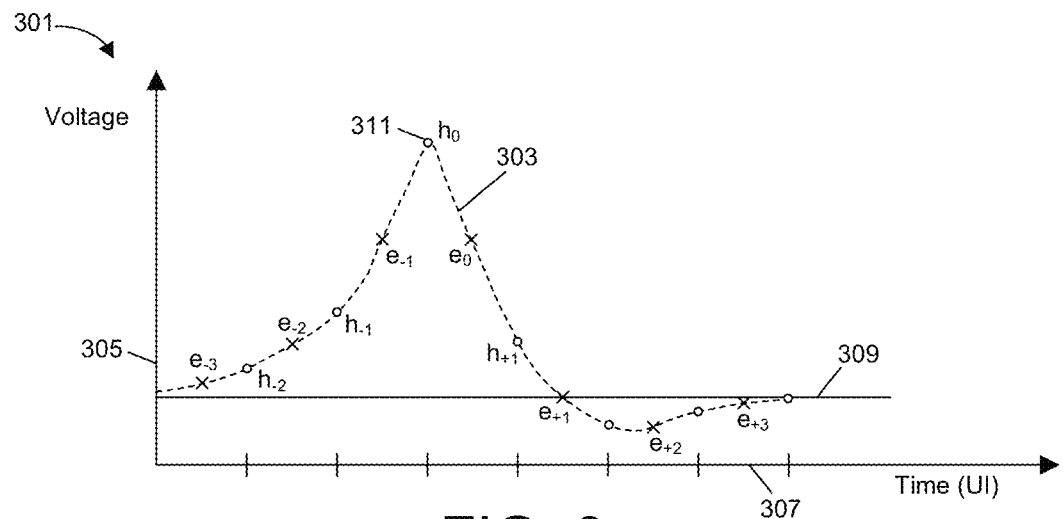
FIG. 3 is plot 101 of voltage versus time for a single-bit response waveform 303.

FIG. 3 provides further detail useful in understanding equalization issues pertinent to clock recovery. In particular, the figure contains a plot 301 of a single-bit response 303 associated with transmitting a unit pulse over a conductive signal path. As transmitted, the unit pulse is ideally a square waveform with a sharp rising edge and sharp falling edge and pulse duration of a single unit interval (UI). However, due to skin effect, dielectric losses, and other factors, this pulse spreads as it travels over the conductive path (dispersion), and appears at the receiver as waveform 303. In this waveform, each "h" designation represents signal strength contributed by this unit pulse both at its sampling time ($h_0$) as well as at sampling times of other symbols relative to $h_0$. For example, $h_{-2}$ represents voltage that partially overtakes a symbol transmitted two symbols previously in the sequence, $h_{-1}$ represents voltage that partially overtakes the immediately previous symbol in the sequence, and $h_{+1}$, $h_{+2}$, and $h_{+3}$ each represent trailing voltage that respectively affect the next three symbols in the sequence following the unit pulse. The "e" designation represents edge sample voltages at times associated with unit interval boundaries at the receiver for transitions between digital symbols in the sequence. $E_{-1}$ represents edge voltage contributed by the unit pulse to the transition to the current symbol (from a previous symbol), $e_0$ representing edge voltage contributed by the unit pulse from to the transition from the current symbol to the ensuing symbol, and so forth. The plot 301 has a vertical axis 305 representing voltage, a horizontal axis 307 representing time in unit intervals (or symbol periods); a horizontal line 309 represents zero volts. The single-bit response can be single-ended, differential, or have some other modulation or encoding scheme.

In a high-speed signaling system, the dispersion represented by FIG. 3 (and associated intersymbol-interference (ISI)) can be large, and equalization is therefore desired so as to adjust the shape of the response in a manner optimized for sampling or for other purposes. For example, as should be apparent, for error-free sampling of a real data stream (whose behavior in a linear system is simply the linear sum of true and complement single-bit responses) what is ideal is that the single-bit response be shaped to maximize $h_0$ while providing for a response that for all other $h_N$ is zero. In other words, if voltage at $h_0$ is maximized, this maximizes signal strength relative to any fixed or random noise that might be present, and therefore effectively minimizes data error. If voltages at $h_{-2}$, $h_{-1}$, $h_{+1}$, $h_{+2}$ and $h_{+3}$ are all zero, what this means is that sampling of the current symbol (e.g., the unit pulse) will be unaffected by other digital symbols, and that the current symbol will also not affect other symbols, e.g. ISI=0. Note that (a) in systems that use DFE, $h_{+1}$, $h_{+2}$ and $h_{+3}$ can all be effectively subtracted out (i.e., to zero) using DFE, and (b) voltage at any edge crossing is irrelevant to sampling at time $h_0$, i.e., what matters is simply that voltage at time $h_0$ is maximized. Conversely, for edge samples such as samples $e_{-3}$, $e_{-2}$, $e_{-1}$, $e_0$, $e_{+1}$ and $e_{+2}$, the ideal single-bit response is one where the voltage at time $e_0$ is exactly equal to $e_{+1}$ (and non-zero), and where voltage is zero for all other edge sample times. Conceptually, this means that the current symbol influences leading and trailing edge sample times by exactly the same amount, and that the current symbol affects no edge crossing other than a crossing shared with its immediately adjacent neighbor symbols. If these conditions hold true, transitions between logic states should always lie exactly at the voltage swing midpoint for a properly aligned clock, and thus edge sampling taken at an expected transition time will be a reliable indicator of whether a recovered clock is early or late.

Reflecting on the discussion of FIG. 3 above, equalization parameters, if applied equally to data sampling and edge sampling, will result in a suboptimal signal for one or both of these purposes. The effect of the suboptimal settings becomes more pronounced at greater data rates, leading to a greater BER in recovered data and a recovered clock with higher jitter. As mentioned, techniques disclosed herein address this issue through the use of split-path equalization.

Figure 4:
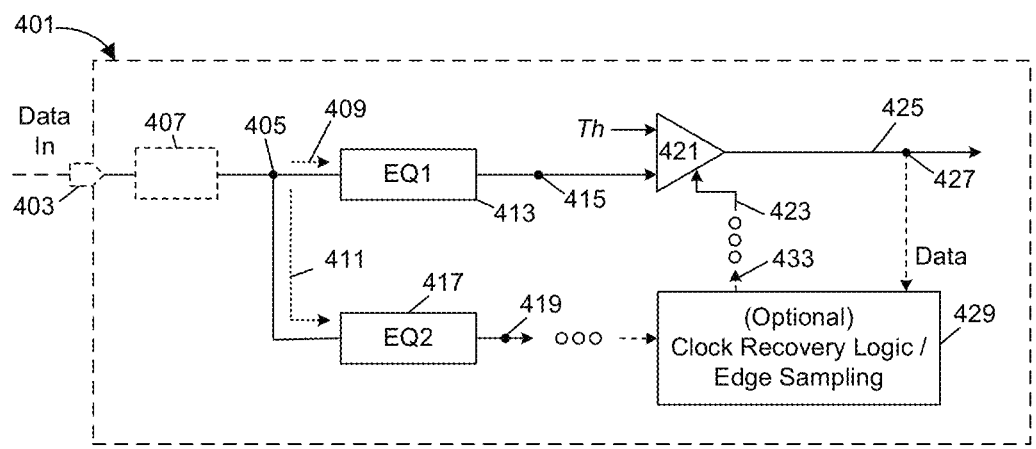
FIG. 4 shows a clock recovery circuit 401 that implements principles of this disclosure.

FIG. 4 shows one embodiment of a clock recovery circuit that uses split-path equalization. More specifically, FIG. 4 uses a dashed box to represent an IC receiver 401. Note that as used herein, the term "IC" encompasses a die, packaged or unpackaged. The IC receiver includes at least one pin or pad (or other form of electrical coupling or contact circuitry 403) that will be wired to an external signal lane once the IC receiver is system-mounted (e.g., installed on a printed circuit board). This at least one pin or pad receives an incoming data signal transmitted from a second, remote integrated circuit (not shown in FIG. 4). The incoming data signal can be transmitted according to any desired format, including without limitation, as a single-ended, differential, duo-binary, 8b/10b, 64b/66b, 128b/130b, 2-PAM, M-PAM, a Manchester-encoded signal, or in another format. In one embodiment, the transmitted signal complies with one of the standards put forth for PCI express (PCIE), Serial ATA (SATA), IEEE 802.3, Display Port, or another serial standard, including any of their revisions. The incoming data signal is provided to a signal node 405 after being passed through optional processing circuitry 407 (e.g., such as electrostatic discharge protection circuitry, a transversal filter, common path equalization, and other types of common path processing discussed below). The signal node 405 distributes the incoming data signal along two different distribution paths 409 and 411, to respective equalization circuits 413 and 417. Note in the context of FIG. 4 that each equalization circuit is a continuous-time linear equalizer (CTLE) circuit, though this is not required for all embodiments. Note further that in one embodiment, the distribution paths are each conductive, while in another embodiment, this distribution can be performed via software, for example, by storing a number in a register and then by performing two different, parallel operations on that number. In accordance with the principles introduced earlier, equalization applied along each path can include one or more settings unique to at least one of the equalization circuits, such that equalization applied along each path is different, as represented by acronyms "EQ1" and "EQ2." One or more of these settings can also be common to both circuits. The first equalization circuit generates a first equalized output, for example, at node 415, and the second equalization circuit generates a second equalized output, for example, at node 419. The first equalized output is then provided to a data sampler 421, which compares the equalized signal against at least one decision threshold Th (typically, but not necessarily, the voltage midpoint between two logic states). The sampler 421 is clocked by a sampling clock 423, generating a binary data signal 425 having a maximum or minimum voltage (e.g., binary "1" or binary "0") depending on the comparison with the threshold. The binary signal is provided to signal node 427 and provides a data recovery output. Note that although not depicted in FIG. 4, this data output is then also fed to a latch or serialized into a shift register, either of which provides a sample and hold function to facilitate interpretation and use of the data.

The outputs from the two equalization circuits provide signals useful for clock recovery. To this end, optional clock recovery logic 429 receives these outputs and generates a recovered clock 433; note that a "recovered clock" is a timing signal that is generated in dependence on timing of the transitions present within an incoming data signal, typically by a circuit that attempts to correlate occurrence of the timing signal's edges with edges in the incoming data signal. As should be apparent, this definition does not require that the timing signal and the incoming data signal have the same frequency. A recovered clock can exist in many forms, such as an edge-sampling clock, a data-sampling clock, a phase vector passed to a phase interpolator, a serial data word-framing signal or, indeed, another form of timing signal. FIG. 4 indicates that the sampling clock 423 is a recovered clock, although this may be a different form of recovered clock than the output 433 of the clock recovery logic.

Figure 5A:
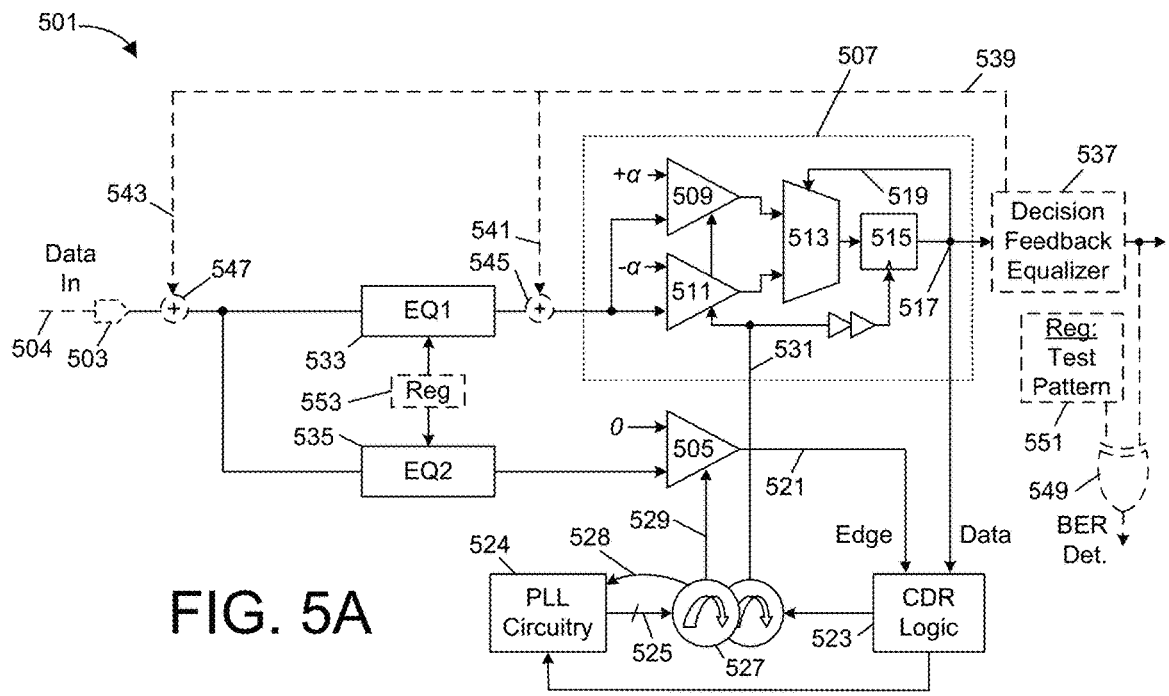
FIG. 5A shows another clock recovery circuit 501 that implements principles of this disclosure.

FIG. 5A shows another clock recovery circuit 501. As with the last example, data is received via a signaling pin (or pins) 503 from an external signal lane 504. This clock recovery circuit uses an edge sampler 505 as well as a partial response DFE (PrDFE) circuit 507. The PrDFE circuit produces data samples for use in clock recovery as well as in data recovery. Briefly, the PrDFE circuit 507 includes two samplers 509 and 511; each of these samplers generates a conditional sample of the incoming data signal by comparing that data signal against a respective voltage threshold (+α or −α, as appropriate). This is to say, this circuit presumes there is some residual voltage from the immediately prior data symbol that affects interpretation of the current symbol (ISI). Again assuming a case of binary signaling, if the current symbol is the second bit (i.e., a binary "0") in the two-bit sequence 1-0, a different voltage at the data sampling time can be expected than if two-bit sequence were instead 0-0. Similarly, the two-bit sequence 1-1 would result in a different voltage at the time of data sampling of the second bit (binary "1") than would the two-bit sequence 0-1. The PrDFE circuit accounts for such variation by taking conditional samples, each one dependent on a different, assumed state of the immediately previous symbol. For example, if the prior symbol (i.e., the first value in the two-bit sequence) is a binary "1", such that the incoming data sequence might represent one of the patterns 1-1 or 1-0, then the output of sampler 509 is passed by a multiplexer 513. This sampler applies a higher decision threshold (+α) based on the assumption that voltage at the time of data sampling of the current symbol has been skewed upward. If the prior symbol (i.e., the first value in the two-bit sequence) is a binary "0", such that the incoming data sequence might represent one of the patterns 0-1 or 0-0, then the output of sampler 511 is passed by the multiplexer 513, effectively applying a lower decision threshold (−α). This circuit (and the use of conditional samples) provides more time to apply feedback for a prior data symbol than a traditional DFE. Note that there exist many forms of PrDFE circuits, including without limitation: (a) other logic designs that achieve similar effect (e.g. other software or hardware logic equivalent to that seen in FIG. 5A); (b) designs that use $2^N$ samplers to account for residual voltage from N previous symbols (i.e., for $2^N$ possible decision thresholds, assuming a binary system); (c) circuits adapted for partial response equalization in a multi-data rate system (e.g., DDR, QDR, etc.); (d) circuits adapted for the use of MPAM signaling (i.e., greater than two signal levels per signal); and (e) other types of circuits. FIG. 5A shows the use of an output latch 515 used to provide a sample and hold function for each digital symbol, and to output one or more bits to a signaling node 517; this output data signal is then provided over feedback path 519 to control selection by the multiplexer 513.

As before, the data signal at node 517, along with edge samples 519 from the edge sampler 505, is provided to CDR logic 523. The CDR logic identifies transitions between reciprocal logic states (e.g. a change from a "0" to a "1" in a binary signaling system, and vice versa) and, depending on the direction of logic state transition, causes an edge sample to accelerate or delay a recovered clock. Any suitable clock recovery logic can be used.

In this regard, a typical clock recovery function is based on a reference clock and locked-loop circuitry, such as phase-locked loop (PLL) circuitry 524. The PLL circuitry 524 uses a phase detector (not shown) to compare the recovered clock (e.g., one of signals 525) with an interpolated, feedback clock 528, and to generate a phase-error signal. This phase-error signal is passed through a filter and accumulated to control to a charge pump. In turn, the charge pump generates a control signal for a variable frequency oscillator (VFO), which generates the recovered clock. In the context of FIG. 5A, the VFO is typically based on a ring oscillator, with multiple recovered clock phases pulled off different resonant stages of the ring oscillator to generate multiple recovered clock phases (525). As voltage (or current) of the control signal goes up or down, the baseline frequency and phase of the recovered clock changes. That is, depending on accumulated error, the PLL circuitry 524 advances or delays the VFO output so as to better align the edges of the a specific recovered clock signal (e.g., one of signals 525) with transition timing of the incoming data signal. The recovered clock phases 525 are provided to a set of phase interpolators 527 and used to generate the interpolated, feedback clock 528. The CDR logic 523 in this depicted embodiment is responsible for selecting the interpolated, feedback clock 528. Note that the set of phase interpolators 527 also generates the edge-sampling clock 529 and the data-sampling clock 531. Each of these is a form of recovered clock.

There are many logic designs that can be applied as the CDR logic 523, including without limitation binary and linear designs. Typical CDR logic functions include (a) restricting use of edge samples to transitions between logic states, i.e., such that samples are only applied when there is an "edge," (b) normalizing a control signal for the PLL circuit and VFO to account for the direction of transition. In addition, some designs can also (c) filter use of edge samples to a specific subset of edge transitions, i.e., so that edge samples for only certain logic transitions are used to control feedback or adjustment of the recovered clock or generation of the interpolated clock. For example, as mentioned, voltage exhibited by the incoming data signal for any given logic state can vary depending on the immediately preceding symbols. The effect of this variation is to skew the signal voltage at the true edge crossing time of the incoming data signal. Assuming for example the use of binary signaling and the presence of such attenuation, voltage representing the binary "0" in the 3-bit sequence 1-1-0 would be greater than for the second binary "0" in the 3-bit sequence 0-1-0; thus, the voltages at the exact midpoint of the "1-0" transition in each of these sequences would also be different. If an edge sample were taken for all such transitions, the edge samples at the time of transition would not be consistent, and would tend to produce recovered clock timing error. That is, a transition voltage associated with the first 3-bit pattern might falsely indicate the recovered clock was early, while a transition voltage associated with the "1-0" transition of the second bit pattern might falsely indicate the recovered clock was late. A combination of the use of both transitions would result in ambiguity of the ideal recovered clock location. It is therefore advantageous in some embodiments to filter edge-samples used for recovered clock updates to one or more specific subsets of all possible logic-level transitions. For example, in the hypothetical just described, the three-bit patterns 0-0-1, 1-0-1, 0-1-0 and 1-1-0 all feature transitions in between the second and the third bits; however, by restricting clock recovery updates "just" to the symmetrical bit patterns 0-1-0 and 1-0-1, one obtains a more consistent set of edge samples that are more tightly correlated with true edge timing. In the embodiment of FIG. 5A, CDR logic 523 optionally performs this type of filtering. Other types of filters are of course also possible. Another appropriate example of sophisticated filtering of edge updates lies within the context of MPAM signaling. Taking 4-PAM signaling for example, a 4-PAM symbol typically has four logic levels, each of which represents a corresponding one of the patterns 00, 01, 10, and 11 in a two-bit sequence. As an analogy to the example just discussed, 00-to-01 and 00-to-11 each represent transitions, but with different edge crossing voltages owing to the different voltages associated with their respective states. In such a situation, a designer might wish to restrict clock recovery updates to full swing transitions (e.g. 00-to-11 and 11-to-00), or to another subset of transitions that have voltage waveforms that consistently cross a specific voltage point at a specific time. Note that any subset of transitions can be used, as long as the restricted set of edge samples passed by the CDR logic 523 filter is tightly correlated with transmit timing. CDR logic 523 can also optionally implement second or third order phase-error control, or other types of filtering as appropriate.

In lieu of the PLL circuitry just described, other circuitry can also be used such as a delay locked-loop (DLL) or another circuit design. The PLL circuitry, DLL circuitry or other similar structure typically includes a feedback loop and means of generating variable timing, such as a variable delay path or VFO, and a means of controlling the timing so as to adjust phase and/or frequency.

As introduced previously, each of the data-sampling path (i.e., the path through the PrDFE circuit 507) and the edge-sampling path (i.e., the path through sampler 505) are the subject of different equalization, EQ1 and EQ2, respectively. In this embodiment, equalization for each path is applied by CTLE circuits 533 and 535 dedicated to each respective path, though this is not required for all embodiments. For example, as indicated, in some embodiments, equalization can be applied using shared circuitry or using software; this will be shown below for example, in connection with FIGS. 6-8. In particular, equalization EQ1 applied by circuit 533 maximizes signal to noise ratio (SNR) of a current data sample (e.g., by maximizing the single-bit response "peak" at time $h_0$ from FIG. 3). Equalization EQ2 applied by circuit 535 does not maximize the peak voltage of the current data sample, but rather, uses frequency-dependent gain to ensure that voltages (from a single-bit response point of view) at the leading and trailing edges of the primary peak single-bit are equal, and that voltages at all other edge times are zero. These were conditions $V(e_{-1})=V(e_0)$ and $V(e_{-3})=V(e_{-2})=V(e_{+1})=V(e_{+2})=V(e_{+3})=0$, discussed above in connection with FIG. 3. Thus, the settings of equalization EQ1 and EQ2 can be significantly different; for example as just indicated, EQ1 can be set to minimize voltage variation at the data sample point and EQ2 can be set to minimize timing variation at the edge sample point.

Finally, FIG. 5A also shows optional use of a decision feedback equalizer (DFE) 537. With digital samples output at signaling node 517, a DFE can be employed to counteract both ISI and long latency reflections in signaling lane 504. The DFE typically will include a shift register, a mechanism for coupling select historical (previous) data symbols from the shift register for use in DFE, a mechanism for weighting (i.e., multiplying) the selected historical data values to obtain respective products, and a summing mechanism that combines each respective product to obtain a correction voltage. This correction voltage is then applied to the incoming data signal at a point prior to data sampling. In some embodiments, the specific latency for each of multiple DFE taps is programmable, or is automatically variable. For example, if in a hypothetical implementation there exists a first additive (constructive) reflection of symbols transmitted ten symbols previously and a second subtractive (destructive) reflection of symbols transmitted twenty symbols previously, a DFE might be configured in situ to use two taps. One of these taps would be applied to multiply the data value for the symbol ten spots prior by a negative weight, and one of these taps would be applied to multiple the data value for the symbol twenty spots prior by a positive weight. A corrective voltage produced by the sum of these weighted values is then added back into the incoming data signal via feedback path 539 to suppress the reflections. Note that since these corrections are applied for substantially whole unit intervals using clocked circuitry, that DFE corrections (if used) can either be added to the data path only (e.g., via branch 541 and summing junction 545) or alternatively prior to the split path of the equalization function (e.g., via branch 543 and summing junction 547). If the latter example is used, care should be taken in the design process to understand the effects (if any) that DFE usage would have on the edge response path. That is, for the depicted embodiment, it is desired that the result of equalization (i.e., the product of CTLE 535 and any DFE usage) be $V(e_{-1})=V(e_0)\neq 0$ and $V(e_{-3})=V(e_{-2})=V(e_{+1})=V(e_{+2})=V(e_{+3})=0$, as discussed in connection with FIG. 3.

Lastly, FIG. 5A shows a comparator 549 (e.g., an XOR gate) and a register 551 adapted to store a test pattern for purposes of calibrating equalization settings. That is, BER can be measured, for example, by the receiver IC or by a transmitter IC, through the sending of a predetermined calibration pattern over the signaling link. Each of the receiver IC and the transmitter IC can be placed into a test mode for this purpose. The receiver IC uses the stored test pattern and compares this against a received pattern as output from the data sampler, for example, as output through signaling node 517. Based on this comparison, bit errors are identified, e.g., based on an output from the comparator 549. By appropriately varying specific transmit or receive parameters (e.g., including voltage threshold, data sampler timing, equalization or other parameters) a bit error rate (BER) metric can be developed over time and used to measure single-bit response and/or appropriate settings for each CTLE circuit 533 and 535. Whether determined by the transmitter IC or the receiver IC, the resultant equalization settings are stored in a register 553 on board the receiver IC and used to control CTLE circuits 533 and 535.

Figure 5B:
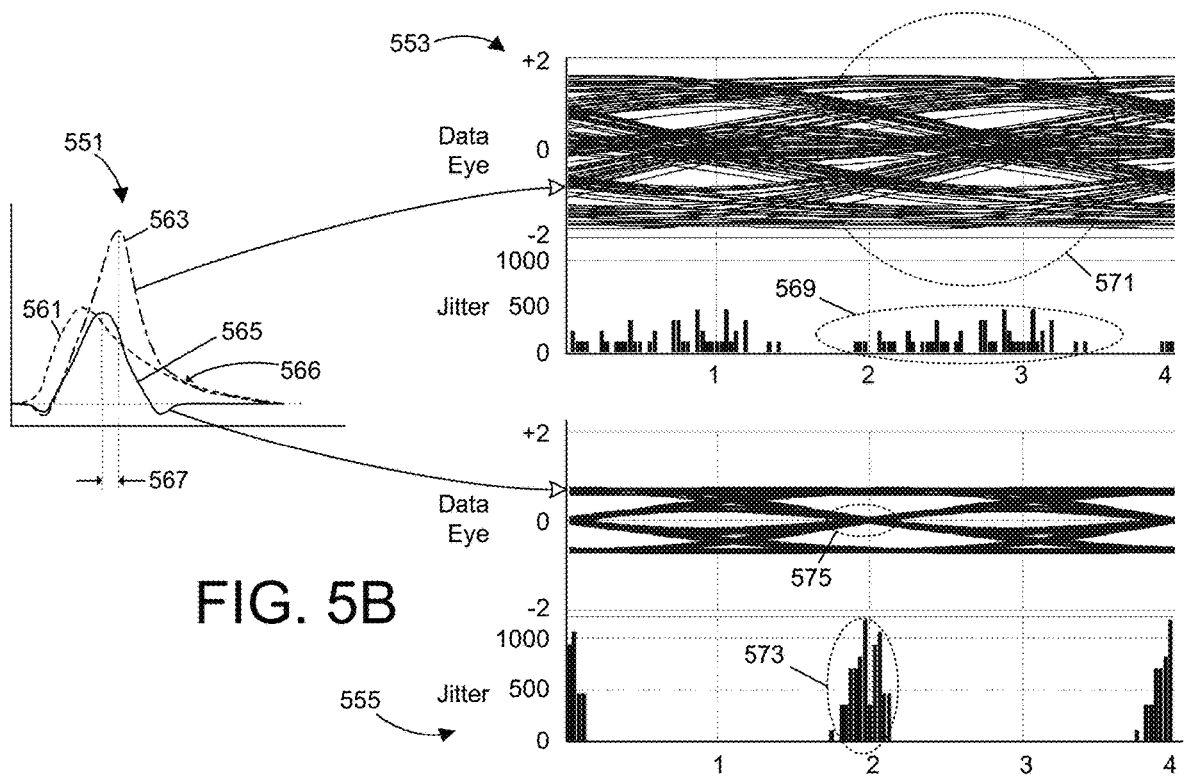
FIG. 5B shows three interrelated plots. A left-most plot 551 shows un-equalized single-bit response 561 for a channel, superimposed over a single-bit response 563 for an equalized signal on the data path and a single-bit response 565 for an equalized signal on the edge. At the right side of FIG. 5B, upper and lower right-half plots 553 and 555 respectively show associated data eye diagrams for the data path and the edge path.

FIG. 5B is used to discuss these equalization settings and to show their effect in cooperation with the circuitry seen in FIG. 5A. In particular, FIG. 5B shows three interconnected plots 551, 553 and 555.

The first plot 551, seen in the left half of FIG. 5B, shows (a) single-bit response 561 for an un-equalized signal, (b) a single-bit response 563 for an equalized data path signal, and (c) a single-bit response 565 for an equalized edge path signal. Through the use of the equalization settings just mentioned, the single-bit response 563 reflects a maximum signal-to-noise ratio and an enhanced peak relative to the single-bit response 561 for the un-equalized signal; however, as should be apparent, both of these single-bit responses are somewhat asymmetric and therefore have inconsistent effect on edge-crossing voltage. By contrast, the single-bit response 565 for the equalized edge path signal is seen to be fairly symmetric, and thus will have far more consistent edges. It is worth noting that because of the different equalization settings resulting in these single-bit responses, the edge and data path single-bit responses will have offset voltage peaks and apparent edges; this offset is represented by difference arrows 567. Although this can lead to a timing offset, this offset is relatively easily dealt with in comparison to the edge distribution. This will be revisited below in connection with FIGS. 7-8.

The second plot 553, seen in the upper right half of FIG. 5B, in fact has two aligned graphs, including a top graph representing data eye height (vertical axis) as a function of unit interval (horizontal axis) and a bottom graph representing a jitter histogram of number of edge occurrences as a function of the same unit intervals. These graphs correspond to the response of the data path of the split-path equalizer. As should be apparent, the top graph shows larger voltage amplitude (spanning nearly −1.8 to 1.8 volts) which indicates higher main tap amplitude ($h_0$). Although the eye seems somewhat closed in this case, DFE will be able to cancel post cursor ISI components, therefore with DFE will achieve higher voltage margin. This is seen by referring to matching ellipses 569 and 571 in the top and bottom graphs, which show inconsistent distribution of measured edge occurrences. However, the voltage margin is quite good for data sampling (at the appropriate sampling instants), as reflected by relatively large data eye height.

The third plot 555, seen in the lower right half of FIG. 5B, also has two aligned graphs, including a top graph representing data eye height (vertical axis) as a function of unit interval (horizontal axis) and a bottom graph representing a jitter histogram of number of edge occurrences as a function of the same unit intervals. These graphs correspond to the response of the edge path of the split-path equalizer. As should be apparent, the top graph shows relatively small voltage margins (spanning perhaps −0.9 volts to 0.9 volts) but with excellent, crisp edge distribution. This is seen by referring to matching ellipses 573 and 575, which show very tight distribution of measured edge occurrences.

Reflecting once again on the conclusions that can be drawn from FIG. 5B, the upper-right plot 553 represents a signal enhanced through equalization and appropriate settings for data sampling, while the bottom-right plot 555 represents a signal enhanced through equalization and appropriate settings for edge sampling. This provides for substantially improved overall timing and voltage margin. Timing margin is improved because edge crossings are more tightly grouped; when processed by CDR logic, this will result in a less jittery recovered clock. Voltage margins are improved because the data sampling path can use optimal settings for the data sampling without having to compromise due to the needs of processing for the edge path.

Figure 6:
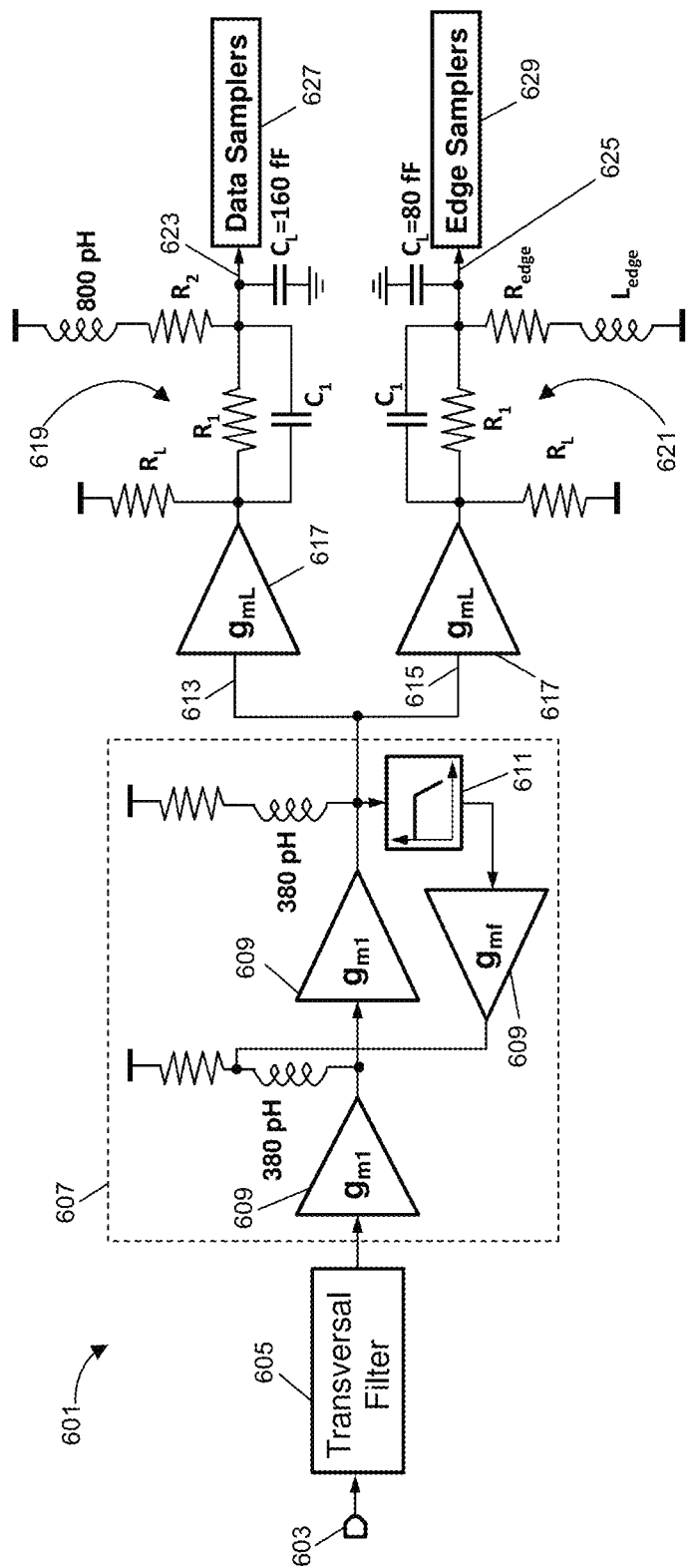
FIG. 6 shows another clock recovery circuit 601 that implements principles of this disclosure.

FIG. 6 shows a more detailed implementation of a clock recovery circuit 601. Once again, it should be assumed that the clock recovery circuit is part of an integrated circuit and more specifically, is associated with receiver circuitry for a specific signal lane. An incoming data signal is received by an IC pin or pins 603 (or other electrical contact or contact circuitry) and is passed to a transversal filter 605. The transversal filter comprises a series of delay elements that provide filtering and electrostatic discharge (ESD) protection for the integrated circuit. Each specific delay element include an input node, a capacitor coupling the input node to ground, an inductor coupling input node to an output node, and two reverse-biased diodes, one connecting the output node to a supply voltage ($V_{dd}$) and one connecting the output node to ground. The output node for each specific delay element is tapped to provide an input to the next delay element in the series as well as an input to a weighting circuit and a summing junction for the specific delay element. The output node of the last delay element in the series is terminated, and an output of the summing junction provides an output of the transversal filter. Each delay element provides delay on the order of a unit interval (UI), or a specific fraction thereof (e.g. ½UI). Through appropriate calibration, each weighting unit can be configured so that the transversal filter substantially eliminates precursor ISI. For example, one possible design uses three such delay elements. The output node of the last of these provides a main cursor tap, while the first two provide taps for immediate precursors to the symbol carried by the main tap. During a calibration stage, bit error rate (BER) can be measured for the specific signaling lane and used to set these various weights so as to eliminate precursor interference. Note that when multiple such delay elements are strung together in series, the respective diodes of each delay element establish a distributed, area-efficient ESD structure that is close to the pins (or other electrical contacts). By combining ESD protection with a transversal filter in the described manner, using analog circuitry, this technique provides passive, low power, area efficient circuitry that can process the incoming data signal without mitigating benefits of the split-path equalization techniques described herein.

Following processing by the transversal filter, the incoming data signal is fed to a feedback loop used to compensate for baseline channel response. That is, while the transversal filter uses a feed-forward response, a second circuit block 607 acts as a common CTLE. In this embodiment block 607 applies relative de-emphasis to low-frequency elements of the incoming data signal and emphasis to high frequency elements of the incoming data signal, as represented by gain elements 609 and a feedback response curve 611. Following this processing, the incoming data signal is split into the data path 613 and the edge path 615 for further equalization. Each path is then normalized for gain (as denoted by reference numeral 617) and is then passed to the respective split CTLE circuits 619 or 621, to equalize the respective paths as has been discussed above. More specifically, each CTLE 619 and 621 is seen in FIG. 6 to consist of similar circuits each including pull-up resistor $R_L$, a series resistance and capacitance in parallel ($R_1$ and $C_1$), a pull-up path consisting of a resistor and an inductor, and a pull-down path consisting of a capacitor. Specifically, in one embodiment, the data-path CTLE 619 is seen to use 800 picoHenries and a resistance of $R_2$ for its pull-up impedance, and 160 femtoFarads for its pull-down impedance. The edge-path CTLE 621 uses $L_{edge}$ picoHenries and $R_{edge}$ for its pull-up path and 80 femtoFarads for its pull-down capacitance. Each of these values is empirically set during the design process and, if desired can be made programmable in situ in a manner consistent with the equalization objectives discussed above (e.g., by using a storage register to retain programmable values and b using thermometer-based control over series or parallel impedances as appropriate). Finally, equalized signals, 623 and 625 are respectively passed to data sampler 627 and edge sampler 629.

It should be understood that the circuit 601 is exemplary only, and that there exist many other equivalent circuits that can effect split-path equalization. First, one contemplated application is to differential signaling, which represents the signaling format of choice for many of the emerging standards (e.g., PCIE gen. 3, SATA 3.0 and other standards). An designer can choose to convert a differential signal to single-ended format for processing, or can differentially process the incoming signal through each of data and edge paths. The techniques presented in this disclosure can also be applied to many other signaling formats. Second, while the designs presented above show some dedicated equalization circuitry applied to each path of a split-path design, it is possible to share some or even much of the equalization circuitry or applied equalization parameters. Even with shared circuitry, aggregate equalization for each path can be electively made different in some respect. That is, circuitry and/or processing used to provide equalization can be shared between each of the split paths, and each of the split paths can be characterized by at least one different equalization setting or parameter. Indeed, for the design just discussed above in connection with FIG. 6, the data and edge paths shared the same transversal filter and ESD circuitry (605) and equalization circuit block (607), each of which performed equalization (e.g., these each constitute a third equalization circuit common to the data and edge paths). Similarly, each of the described CTLE circuits 619 and 621 is clearly depicted to use several impedances with common values, and thus may impart common gain, common frequency cut-off, or other parameters in common. Further, while split-path equalization was discussed in the context of a clock recovery circuit, split-path equalization can be applied to many other circuit designs or contexts. For example, while a split-path equalizer was discussed in the context of different linear equalization applied to each path, it is possible to apply split-path concepts to DFE, PrDFE or other forms of equalization. Equalization as mentioned can be performed in software. Thus, as should be apparent, the general concepts introduced above can be applied to many different circuits or system designs.

III. Data/Edge Peak Skew in Split-Path Clock Recovery

As was noted above and as is known in high-speed signaling, an appropriate timing instant for data sampling occurs in a manner offset from, and typically near the timing midpoint between UI boundaries. In some systems, for example, a data-sampling clock is fixed at ninety degrees offset relative to an edge clock. In other systems, an empirically determined timing offset is used which can be greater than or less than ninety degrees. For example, if a data signal is asymmetric, a single-bit response can be earlier or later than ninety degrees, and some designers chose to match the offset to the instant of peak response. In still other systems, a timing offset is used which simultaneously minimizes precursor ISI while maximizing non-precursor peak voltage.

For clock and data recovery designs based on split-path equalization, an added timing offset can occur from the different equalization settings for the split-paths. For example, as was pointed out in connection with FIG. 5B, above, peak position and edge distribution in the data-sampling path can be offset relative to peak position and edge distribution in the edge-sampling path. Addressing this skew can present a challenge particularly for designs where split-path equalization settings are calculated in situ. For example, as was alluded-to earlier, a receiver IC can be designed to determine equalization settings only once it is installed in a system with a transmitter, in a manner that adjusts to specific channel attenuation specific to that system. In such a design, it will typically be desired to measure equalization-induced skew and make related adjustments to the data-sampling offset.

Figure 7:
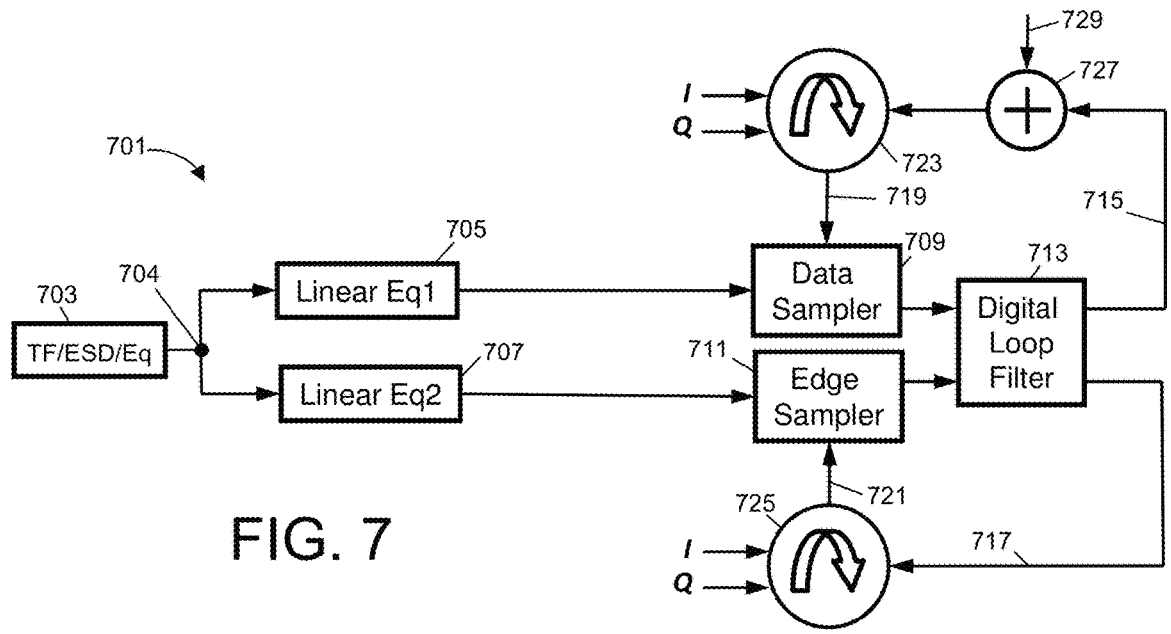
FIG. 7 shows another clock recovery circuit 701.

FIG. 7 shows a clock recovery circuit 701 that uses split-path equalization and includes structure for addressing equalization skew between data and edge paths. As before, the disclosed circuit can optionally be implemented as part of an IC receiver that receives an incoming data signal from an external signaling path. The IC can be installed on a printed circuit board, as part of a personal computer or portable digital device, or in another type of system. In a digital system, the IC will typically be electronically connected via pins, pads or other connection circuitry to conductive traces present in the system. Whether implemented in such a context or not, the incoming data signal is first subjected to optional ESD, transversal filter and other common path circuit elements, as denoted by numeral 703 and as was described above in connection with FIG. 6. Note once again that the effective of this processing can be to provide some level of equalization in a manner common to both of the split paths. These circuit elements output a first equalized version of the incoming data signal, at signaling node 704. The path for the incoming data signal is at this point split, to provide for the separate data and edge paths. The data path passes through a first linear equalizer 705, while the edge path passes through a second linear equalizer 707. Each equalizer respectively provides equalization using one or more settings that can independently be set or defined for each path. As mentioned earlier, in one embodiment, one or more of these settings are different, and in another embodiment, one or more of these settings are in common. Also as mentioned earlier, shared or different circuitry can be used to equalize the respective paths; in an IC context, it will frequency be desired to provide dedicated circuits to implement each linear equalizer 705 and 707, with physically-separated conductive paths; however, respective processing for each path can also be done in software or via other means. In the specific context of FIG. 7, it will usually be desired to maximize signal-to-noise ratio (SNR) of the data path, and to even-out edge distribution for unit pulses at the bounds of its respective unit interval (UI), while suppressing distortion of at any other edge time.

These equalization settings have the potential to skew the data path response relative to the edge path response. Returning briefly to FIG. 5B, left-most plot 551, it should be observed that the data-path single-bit response 563 has a relatively steep rising edge, but a shallower falling edge (see, e.g., the area designated by arrow 566); by contrast, the edge-path single-bit response 565 is more symmetrically shaped. The effective of this difference is to shift the relative centers of these single-bit responses in a manner dependent on difference in the applied equalization settings, as indicated by arrows 567.

The embodiment of FIG. 7 addresses this issue by using a calibrated phase offset to adjust the sample instants used for the data path of the split path equalizer. First, equalized versions of the incoming data signal from linear equalizers 705 and 707 are provided to respective samplers 709 and 711. Samples produced by these circuits are then input to a digital loop filter 713. This loop filter can include PLL circuitry as discussed earlier, or other circuitry that controls a generated clock or generates a timing signal in a manner aligned with transitions in an input signal. The digital loop filter then generates timing control signals 715 and 717 for each of data and edge paths, to control specific phase used for respective data and edge sampling clocks 719 and 721. In particular, each control signal 715 or 717 is applied to a phase interpolator 723 or 725 to mix multiple phases of the recovered clock inputs (depicted as I and Q inputs) to generate a specific phase of recovered clock in discrete steps. Note that if the VFO (not depicted in FIG. 7) is based on a ring oscillator circuit that recovered clock phases I and Q can be drawn directly from the resonant stages of such a circuit. In fact, in one embodiment, eight or more recovered clock phases can be produced by the VFO, with each phase interpolator 723 or 725 selecting between 128 or more discrete interpolated phases in dependence on the respective control signals 715 and 717. It should be understood that, although FIG. 7 uses reference letters I and Q to denote a quadrature clock, any number of recovered clock phases can be used.

Note that the control signal 715 for the data-path phase interpolator 723 passes through a summing junction 727. It is at this point that an added offset signal 729 is injected, in order to compensate for the skew discussed above in connection with FIG. 5B. In the depicted embodiment, this offset signal is determined by measuring bit error rate (BER) and selecting an offset for injection via path 729 that yields the lowest BER following clock lock.

With reference again to FIG. 5A, it is noted that the depicted clock recovery circuit includes a comparator 549 and an optional register 551 to store a test pattern. To calculate BER, the clock recovery circuit can be put into a test mode, for example, as triggered by a control signal from a transmitter IC. The transmitter IC then transmits a repeating test pattern that corresponds to the pattern stored in the register 551. During this process, the injection path 729 (in FIG. 7) is swept through different values at a relatively slow rate while BER is measured. In one embodiment, the lowest BER is selected, while in another embodiment, the middle of a window of BER acceptability can be used. For example, in one embodiment, there are 128 possible phase offsets that can be selected via injection path 729; if values in a specific range within these 128 possibilities satisfy a threshold BER criteria, then then middle value of the range can be adopted as the appropriate phase offset for use during normal operation. Other techniques are also possible. Note that there are many BER measurement techniques, some of which can be implemented entirely in a receiver IC. To cite one example, instead of storing a test pattern, a receiver can employ an extra "roving sampler" that determines margins relative to live data, by using selectively-variable thresholds and clock offsets to calculate error margins.

The embodiment of FIG. 7 is suitable for reducing skew in many applications, but unless additional sampler circuitry is used, presumes prior lock of a recovered clock for purposes of estimating offset between equalization paths. For emerging serial standards that require a fast clock lock, with clock lock dependent on accurate data sampling, it may be desired to detect signal presence and lock a clock even when a data-sampling clock is initially misaligned with transition regions of the incoming data signal.

Figure 8:
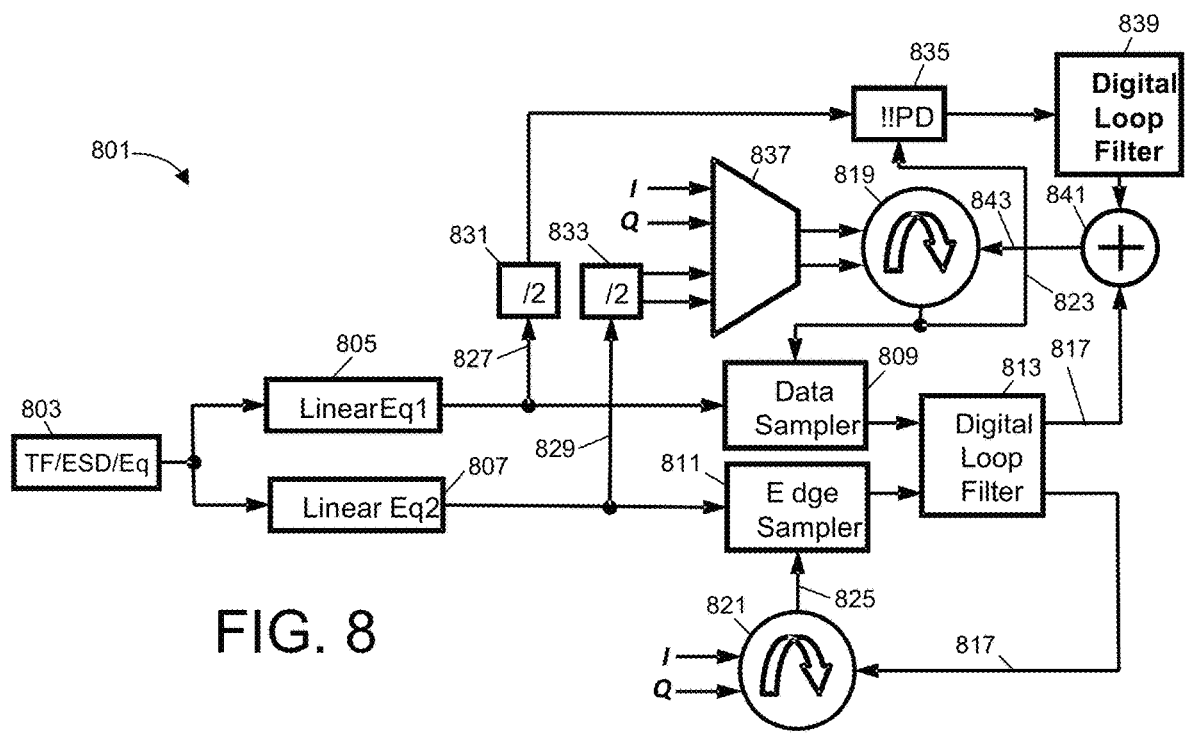
FIG. 8 shows another clock recovery circuit 801.

FIG. 8 shows another embodiment of a clock recovery circuit 801 that is much like the embodiment just discussed. However, the embodiment of FIG. 8 provides the ability to lock a recovered clock even when a data sampling instant is misaligned or anti-aligned with the incoming data signal.

As before, an incoming data signal is received and processed by common path circuitry 803 and is subject to split-path equalization, as indicated by numerals 805 and 807. Data-path and edge-path equalized outputs are then provided to respective samplers 809 and 811, which once again control a digital loop filter 813 to generate data-sampling clock and edge-sampling clock control signals 815 and 817. These control signals are used to control respective phase interpolators 819 and 821, to cause these phase interpolators to generate a data-sampling clock and edge-sampling clock, 823 and 825, respectively. However, to address misalignment, the clock recovery circuit also directly processes the data-path and edge-path versions of the incoming data signal, 827 and 829 respectively. During a calibration mode, each of these two versions is effectively converted into a timing signal and divided by two. The data-path signal from a first divide-by-two circuit 831 is passed as a first input to a phase detector 835, while the edge-path signal from a second divide-by-two circuit 833 passed to a multiplexer 837. This multiplexer, during a test mode, passes phases of the edge-path timing signal as inputs to the data path phase interpolator 819. During calibration, the clock recovery circuit then uses the phase detector 835 to eliminate phase difference by selecting an offset code representing a phase-step effective to cancel skew between the edge-path and the data path. A digital loop filter 839 and summing junction 841 in effect modify the data-path interpolator control signal 817 by selecting a phase-code that subtracts out skew. Thereafter, when the test mode is exited and normal operation resumes, the digital loop filter 839 and summing junction 841 hold the skew correction code, which results in a modified interpolator control signal 843.

Several features of the clock recovery circuit 801 should be apparent. First, the use of the phase interpolator 819, the phase detector 835, the multiplexer 837, and the digital loop filter 839 do not require data samples (i.e., valid data samples or otherwise); thus, the circuit depicted in FIG. 8 can operate in the absence of clock lock. This is to say, clock-lock is not required prior to correcting for skew. This design is also robust even under conditions of frequency offset or anti-alignment between the recovered clock and the incoming data signal. Finally, this design is also relatively power efficient, since it uses minimal additional hardware relative to the clock recovery circuit of FIG. 7 (e.g., an extra phase detector, an extra digital loop, a multiplexer and divide-two-circuitry). Note also that this design can result in a situation where a clock is locked concurrent with decision feedback equalization representing error in the data. This is to say, in an embodiment that also uses DFE, erroneous DFE based on invalid data samples can still be present in the system for a short time following lock if the recovered clock is poorly aligned ab initio, owing to the fact that the recovered clock is locked in the absence of valid data signals.

Note that there are many alternative circuits to the specific design seen in FIG. 8. For example, it is possible to use one phase interpolator only on a shared basis, or to use a voltage controlled delay line, or another means of offsetting phase of a data-sampling clock relative to an edge-sampling clock. Other design variations also exist.

Figure 9:
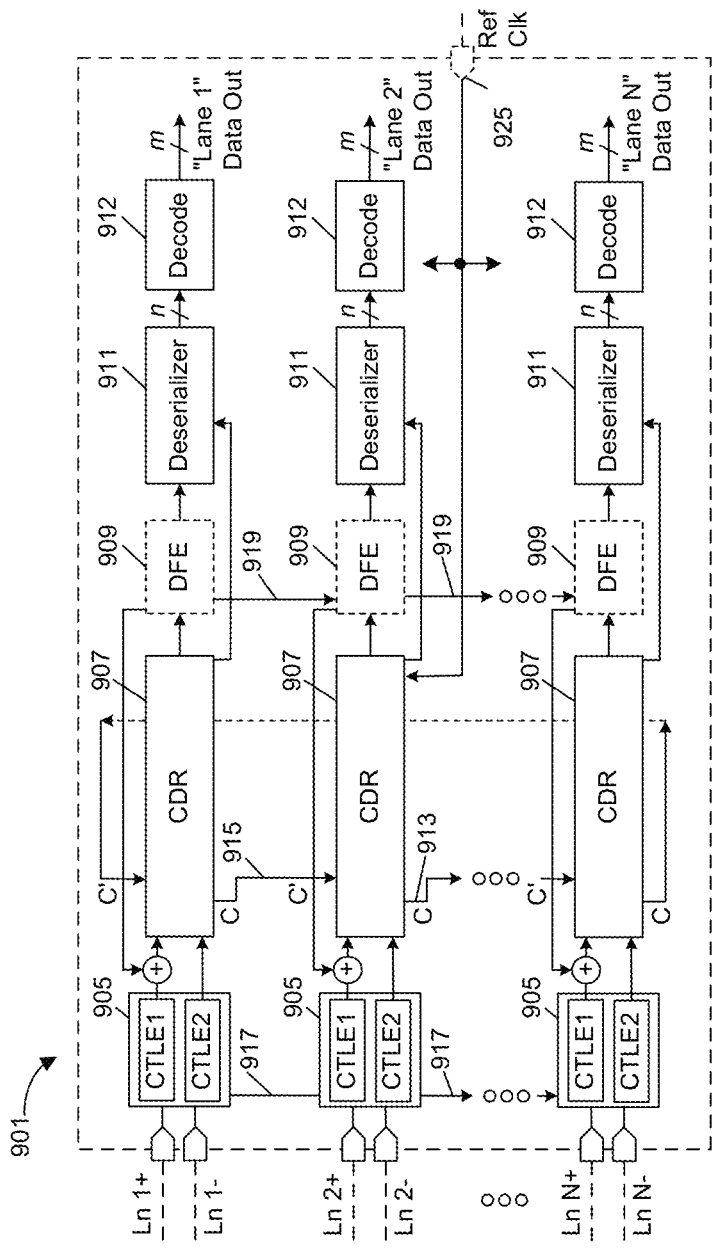
FIG. 9 shows an integrated circuit 901 having plural differential lanes, each with split-path equalization settings (block 905), a respective clock and data recovery (CDR) circuit 907, an optional DFE 909, an optional deserializer 911 and an optional decoder 912.

FIG. 9 is an illustrative diagram 901 of an integrated circuit with receivers for plural differential lanes, each with each receiver having optional equalization circuitry (905/909), a respective clock and data recovery (CDR) circuit 907, an optional deserializer 911 and an optional decoder 912. The CDR circuit for each lane can be predicated on the clock recovery techniques discussed above. Note that each incoming data signal (i.e., the signal for each lane) is depicted as a differential signal, that is, comprising positive and negative differential component paths, such as indicates by component signals Lane 1+/− (Ln1+ and Ln1−), and so forth.

Generally speaking, at higher signaling rates, it becomes increasingly difficult to interpret signals without some form of receiver-based equalization. It is noted that many standards for high-speed signaling formats either call for or permit some form of receiver-based equalization. In this regard, a split-path continuous-time linear equalizer (CTLE) 905 provides a means to equalize attenuation attributable to channel loss with enhanced jitter performance, especially at high signaling rates. A DFE 909 for each lane relies on the digital values of previously received and interpreted digital symbols from the respective incoming data signal. As mentioned, these values are typically used to negate reflections in the signaling line or impedance discontinuities; these digital values are therefore weighted, summed, and used to generate an analog voltage that is subtracted from the incoming data signal. In the embodiment depicted in FIG. 9, it is assumed that some form of DFE is used for each lane (i.e., to address at least one post-cursor) although, here also, the DFE can be optional depending on embodiment.

A receiver for each lane is also seen to include a deserializer 911, to convert n consecutively received data symbols into n parallel bits (as represented by the slash across each lane's respective deserializer output). A recovered clock from the CDR is used to generate a lower-frequency framing signal to unload the respective deserializer 911 at the appropriate time, and otherwise for timing the processing of consequent parallel words of data. For example, if the recovered clock has a frequency of 20 gigahertz with double data rate (DDR) signaling, each deserializer 911 (depending on circuit design) can receive 40 billion bits per second and output 4 billion 10-bit data words (e.g., n=10). Thus, a framing clock can be derived from the recovered clock and used to process wider, parallel words at a fraction of the signaling rate, e.g., at $\frac{1}{10}^{th}$ that rate in this example. Depending on encoding methodology used to convey the embedded clock, each parallel word can then be reduced to a fewer number of bits. For example, if 8b10b encoding is used, a decoder for each lane can receive 10 parallel bits (n=10) and output 8 parallel bits (m=8). Each lane's output in this example would therefore be a byte of information, clocked out of the respective receiver at a fraction of the signaling rate or symbol rate.

In generating a recovered clock, a global clock of the receiver integrated circuit can be driven responsive to the recovered clock of one of the lanes, or based on processing (e.g., filtering or other averaging) of the recovered clock from all of the lanes and based on a timing reference signal, for example, input via pin 925. Such a global clock can also be used for transmit timing for data transmitted to another integrated circuit, for example, in an opposite direction over the signaling lanes 1-N, or to a third integrated circuit.

A clock recovery circuit for some embodiments can also be selectively programmed for operation in a slave mode. That is, by including a multiplexer to select between the output of CDR logic for each lane (e.g., logic 523 from FIG. 5A) and a phase update output from another master lane, and passing the selected output to a PLL for each "slave lane," a multi-lane circuit such as seen in FIG. 9 can be operated with substantial power savings. FIG. 9 provides an IC where the clock recovery circuitry of one lane can be put into master mode, and where the clock recovery circuitry of other lanes can be put into slave mode. In embodiments where all lanes originate from a common source, e.g., a transmitting integrated circuit (not shown) where transmit timing for all lanes is derived from a common timing reference, it is expected that the recovered clock for each lane will have the same frequency, but respective phase offset. In such an implementation, all lanes are initially operated in master mode to select a phase specific to each lane (e.g., as represented by a current selection of interpolator phase and a lane-specific VFO control signal magnitude). Once each clock is locked, e.g., as may be detected from the presence of dithering in the respective binary phase-error signal, assumed following passage of a fixed period of time or detected through other means, the phase detector circuitry for each slave lane is turned "off." That is, the associated clock recovery circuitry is placed into slave mode by writing a value to an appropriate register, depowering phase detector circuitry as appropriate, and configuring a multiplexer control signal for each lane. With reference to FIG. 9, subsequent "up/down" or linear phase updates from CDR logic form one "master" lane are passed as the "C" output of the clock recovery circuit for that lane and received as the "C-prime" input of the ensuing lane. By putting all lanes other than one (e.g., "Lane 1") into slave mode, receiver circuitry for each lane will take phase updates from the previous lane in this manner while preserving phase separation relative to other lanes. While the phase detector circuitry for slave lanes is depowered, the phase detector for the master lane in master mode (and associated phase-error updates) continues to operate and shares its phase updates to adjacent slave lanes. The receivers for lanes in slave mode continue to apply a transversal filter and ESD protection for example (see e.g., FIG. 6, with this circuitry being considered optional for the embodiment of FIG. 9). Optionally, other equalization circuitry such as the CTLE for each slave lane's edge path can be turned off based on the assumption that timing jitter is correlated between lanes based on the use of a common timing reference in a transmitter. Only the master lane is needed on a marginal basis to track timing jitter for all lanes because of this correlation. In such an implementation, it can be advantageous to re-enter master mode for each lane on a periodic basis in order to update any change in phase separation between lanes.

Other signals can be shared between lanes as well. For example, if signaling paths are trace-matched, it is be possible to share linear equalization settings, equalization tap latency selection and specific tap weights, as represented by signals 917 and 919.

IV. Conclusion

The description presented above provides examples of split-path equalization as well as enhanced clock and data recovery designs based on split-path equalization. As indicated, these techniques can optionally be employed within a single integrated circuit that receives one or many signaling lanes. A number of optional features have also been described, for example, the use of skew mitigation techniques to account for equalization-induced skew between split paths. Note that not all embodiments require skew mitigation or this particular form of skew mitigation. Additionally, while the use of relatively simple straightforward CDR logic has been described, it should be appreciated that many alternative techniques can be used, for example, that operate on MPAM signals and multi-data rate signals with any type of transition processing or filtering desired. For example, in an MPAM system (e.g., where many types of logic level transitions are possible), a designer can choose to limit clock recovery updates to a filtered set of specific logic level transitions, for example, transitions between two specific logic states only. Many other types of filtering are possible, and many conventional clock recovery designs can be enhanced predicated upon the split-path equalization techniques introduced above. Similarly, while binary samplers have been referred to for some specific designs, nearly any type of circuitry can be used that obtains a sample of a data signal. For example, as discussed earlier, a PrDFE can be used as data sampler (e.g., having more than one sampler, with each sampler generating a conditional sample). Also, each sampler can be simple binary sampler, comparator, analog-to-digital converter, an integrating sampler, or another type of circuit. In one embodiment, as mentioned, the incoming data signal is a binary signal and simple samplers are used. In an embodiment where the incoming data signal is an MPAM signal, more complex circuitry is used.

It should be noted that the subject matter disclosed herein can be expressed (or represented), as data and/or instructions embodied in various computer-readable storage media, meaning physical non-transitory media such as computer memory, storage disks and the like. In this context, the described subject matter can take the form of instructions or data for fabricating an integrated circuit that, when built and operated, possesses the circuits and structures, and performs the techniques described herein. An output of a process for designing an integrated circuit, or a portion of an integrated circuit, comprising one or more of the circuits described herein may be such a computer-readable medium such as, for example, a magnetic tape or an optical or magnetic disk, or other non-volatile physical storage. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

In addition, in the foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit comprising:
   receiver circuitry to sample an incoming data signal arriving via a conductive signal path, the incoming data signal carrying a sequence of data symbols;
   first equalization circuitry to provide continuous time linear equalization to equalize sampling of the incoming data signal in a manner so as to emphasize a symmetric edge response; and
   second equalization circuitry to equalize sampling of the incoming data signal so as to emphasize a signal-to-noise ratio;
   wherein the receiver circuitry is to sample an output of the second equalization circuitry at data-sampling times, to recover the data symbols;
   wherein the receiver circuitry further comprises circuitry to sample an output of the first equalization circuitry at expected edge times, and circuitry to recover timing of a clock signal embedded in the incoming data signal in dependence on the samples taken at the expected edge times.

2. The integrated circuit of claim 1, wherein the circuitry to recover the timing of the clock signal embedded in the incoming data signal is to recover the timing in a manner that is also dependent on an output of the second equalization circuitry, sampled in a manner that is dependent on symbol state transitions of the incoming data signal.

3. The integrated circuit of claim 2, further comprising pattern filter to restrict update of timing of the clock signal in dependence on recognition of at least one predetermined pattern of successive ones of the data symbols, each predetermined pattern of the at least one predetermined pattern being at least three consecutive symbols in length and having respective, predetermined logic state values, as determined from an output of the receiver circuitry.

4. The integrated circuit of claim 1, wherein the first equalization circuitry and the second equalization circuitry are to receive respective, programmable equalization settings.

5. The integrated circuit of claim 1, wherein the second equalization circuitry comprises a second continuous time linear equalizer.

6. The integrated circuit of claim 5, wherein:
the integrated circuit further comprises a third continuous time linear equalizer to provide equalization to the incoming data signal, the third linear equalizer to deemphasize precursor interference, to generate an equalized version of the incoming data signal;
the first continuous time linear equalizer is to provide further equalization to the equalized version of the incoming signal; and
the second continuous time linear equalizer is to provide further equalization to the equalized version of the incoming data signal.

7. The integrated circuit of claim 5, wherein:
the integrated circuit further comprises circuitry to provide electrostatic discharge (ESD) protection to the incoming data signal, to generate a protected version of the incoming data signal;
the first continuous time linear equalizer is provide equalization to the protected version of the incoming data signal; and
the second continuous time linear equalizer is to provide equalization to the protected version of the incoming data signal.

8. The integrated circuit of claim 1, wherein:
the integrated circuit further comprises third equalization circuitry to provide equalization to the incoming data signal, to emphasize high frequencies relative to low frequencies, to generate an equalized version of the incoming data signal;
the first equalization circuitry is to provide further equalization to the equalized version of the incoming data signal; and
the second equalization circuitry is to provide further equalization to the equalized version of the incoming data signal.

9. The integrated circuit of claim 1, wherein:
the incoming data signal is to be transmitted to the receiver circuitry from a source external to the integrated circuit; and
the integrated circuit further comprises logic to provide a calibration mode to determine settings respectively to the first equalization circuitry and the second equalization circuitry, and storage to store the settings in storage of the integrated circuit for application during a normal mode of operation of the integrated circuit.

10. The integrated circuit of claim 1, wherein each of the data symbols is a bit of data.

11. The integrated circuit of claim 1, wherein:
the circuitry to recover the timing of the clock signal is to recover an edge clock and a data clock, the edge clock to trigger sampling of the incoming data signal at expected edge times and the trigger sampling of the incoming data signal at the data-sampling times, the data-sampling times being in-between the expected edge times;
the integrated circuit further comprises storage to store a programmable phase offset; and
the circuitry to recover the timing of the clock signal is to offset the data clock relative to another one of the recovered clocks according to the programmable phase offset, to thereby establish the data-sampling times.

12. The integrated circuit of claim 1, wherein the conductive path comprises a differential path and wherein the receiver circuitry comprises at least one differential sampler.

13. The integrated circuit of claim 1, wherein the integrated circuit further comprises a decision feedback equalization (DFE) circuit to adjust at least one of the incoming data signal, the output of the second equalization circuitry, or a decision threshold used by the receiver circuitry, so as to recover each of the data symbols in dependence on logic state of a previously-received one of the data symbols.

14. An integrated circuit having contacts to couple to respective conductive signal paths, each of the respective conductive signal paths to provide an incoming data signal carrying a respective sequence of data symbols, the integrated circuit comprising, for each of the conductive signal paths:
receiver circuitry to sample the incoming data signal provided by the respective conductive signal path;
first equalization circuitry to provide continuous time linear equalization to equalize sampling of the incoming data signal provided by the respective conductive signal path in a manner so as to emphasize a symmetric edge response; and
second equalization circuitry to equalize sampling of the incoming data signal provided by the respective conductive signal path so as to emphasize a signal-to-noise ratio;
wherein the receiver circuitry for each one of the conductive signal paths is to sample an output of the second equalization circuitry which is respective to the one of the conductive signal paths at data-sampling times, so as to recover the data symbols of the sequence provided by the one of the conductive signal paths;
wherein the receiver circuitry for each given one of the conductive paths further comprises circuitry to sample an equalized output version of the incoming data signal provided by the first equalization circuitry for the given one of the conductive signal paths, at expected edge times, and circuitry to recover timing of a clock signal embedded in the incoming data signal provided by the samples taken at the expected edge times for the given one of the conductive signal paths.

15. The integrated circuit of claim 14, wherein each of the data symbols is a bit of data.

16. The integrated circuit of claim 14, wherein each of the conductive paths comprises a differential path and wherein, for each of the conductive signal paths, the receiver circuitry comprises at least one differential sampler.

17. The integrated circuit of claim 14, wherein for each given one of the conductive signal paths, the integrated circuit further comprises a respective decision feedback equalization (DFE) circuit to adjust at least one of the incoming data signal provided by the given one of the conductive signal paths, an output of the second equalization circuitry which is respective to the given one of the conductive signal paths, or a decision threshold used by the receiver circuitry for the given one of the conductive signal paths, to sample each of the data symbols of the incoming data signal provided by the given one of the conductive signal paths in dependence on logic state of a previously-received data symbol provided by the given one of the conductive signal paths.

18. A method of operating an integrated circuit having receiver circuitry, first equalization circuitry and second equalization circuitry, the method comprising:

sampling an incoming data signal provided by a conductive signal path with the receiver circuitry, the incoming data signal carrying a sequence of data symbols;

equalizing sampling of the incoming data signal with the first equalization circuitry using continuous time linear equalization, in a manner so as to emphasize a symmetric edge response; and equalizing sampling of the incoming data signal with the second equalization circuitry so as to emphasize a signal-to-noise ratio;

wherein the method further comprises sampling an output of the second equalization circuitry with the receiver circuitry at data-sampling times, to recover the data symbols, sampling an output of the first equalization circuitry at expected edge times, and recovering timing of a clock signal embedded in the incoming data signal in dependence on the samples taken at the expected edge times.

* * * * *